United States Patent
Tu (10) Patent No.: US 9,577,357 B2
(45) Date of Patent: Feb. 21, 2017

(54) ELECTRICAL CONNECTOR WITH A CARRIER AND TERMINALS LOCATED AT DIFFERENT DISTANCES FROM SIDE WALLS

(71) Applicant: LOTES CO., LTD, Keelung (TW)

(72) Inventor: Xue Ming Tu, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 14/920,088

(22) Filed: Oct. 22, 2015

(65) Prior Publication Data

US 2016/0352029 A1   Dec. 1, 2016

(30) Foreign Application Priority Data

May 29, 2015  (CN) .................... 2015 2 0356397 U
Jun. 30, 2015  (CN) .................... 2015 2 0472583 U (51) Int. Cl.
*H01R 13/62*   (2006.01)
*H01R 12/70*   (2011.01)
*H01R 12/88*   (2011.01)

(52) U.S. Cl.
CPC .......... *H01R 12/7076* (2013.01); *H01R 12/88* (2013.01)

(58) Field of Classification Search
CPC ..... H01R 12/00; H01R 13/62; H01R 12/7076; H01R 23/684; H01R 23/7026; H01R 23/7057; H01R 23/7063; H01R 9/091; H01R 12/718; H01R 12/88
USPC .......................................... 439/330, 331, 78
See application file for complete search history.

(56) References Cited

U.S. PATENT DOCUMENTS

| | | | | | |
|---|---|---|---|---|---|
| 4,706,161 | A | * | 11/1987 | Buckingham | H05K 7/1023 174/51 |
| 5,302,853 | A | * | 4/1994 | Volz | H01L 23/4093 257/707 |
| 5,499,929 | A | * | 3/1996 | Miyazawa | H01R 12/7064 439/331 |
| 6,776,625 | B2 | * | 8/2004 | Ma | H01R 13/62933 439/330 |
| 6,971,902 | B2 | * | 12/2005 | Taylor | H01R 13/2442 439/331 |
| 7,001,197 | B2 | * | 2/2006 | Shirai | H01L 23/32 257/E23.086 |
| 7,566,237 | B2 | * | 7/2009 | Gattuso | H01L 23/4093 439/331 |

(Continued)

*Primary Examiner* — Chandrika Prasad
(74) *Attorney, Agent, or Firm* — Locke Lord LLP; Tim Tingkang Xia, Esq.

(57) ABSTRACT

An electrical connector for electrically connecting with a chip module includes an insulating body having a bottom wall, multiple rows of terminals located in the bottom wall for electrically connecting the chip module, and a carrier for carrying the chip module to the insulating body. Two first side walls extend from two opposite sides of the bottom wall upward, and two second side walls extend from the other two opposite sides of the bottom wall upward. There are a first gap between the first side wall and a most peripheral terminal corresponding to the first side wall, and a second gap between the second side wall and a most peripheral terminal corresponding to the second side wall. The first gap is greater than the second gap. The carrier has a buckling portion, received in the first gap, and for buckling a bottom surface of the chip module.

20 Claims, 9 Drawing Sheets

(56) References Cited

U.S. PATENT DOCUMENTS

| | | | | |
|---|---|---|---|---|
| 8,834,192 B2* | 9/2014 | Terhune, IV | ........ | H05K 7/1053 439/331 |
| 8,979,565 B2* | 3/2015 | Yeh | ........................ | H01R 12/88 439/331 |
| 2008/0220643 A1* | 9/2008 | Zhang | ................... | H05K 7/1053 439/331 |

* cited by examiner

ELECTRICAL CONNECTOR WITH A CARRIER AND TERMINALS LOCATED AT DIFFERENT DISTANCES FROM SIDE WALLS

CROSS-REFERENCE TO RELATED APPLICATION

This non-provisional application claims priority under 35 U.S.C. §119(a) on Patent Application No. 201520356397.8 filed in P.R. China on May 29, 2015, and Patent Application No. 201520472583.8 filed in P.R. China on Jun. 30, 2015, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to an electrical connector, and more particular to an electrical connector for electrically connecting with a chip module.

BACKGROUND OF THE INVENTION

An electrical connector for electrically connecting with a chip module in the industry includes an insulating body, conducting terminals received in the insulating body, a frame disposed around the insulating body, and a cover and a lever that are assembled onto the frame. During operation, the lever is first rotated and opened, and then the cover is rotated and opened. The chip module is placed on the insulating body and contacts the conducting terminals. Then the cover is rotated and closed, finally the lever is rotated and closed, and the lever presses the cover to enable the cover to press the chip module, so that good electrical connection is achieved between the chip module and the conducting terminals.

During use of the foregoing electrical connector, the chip module needs to be manually assembled onto the insulating body, and a situation in which alignment between the chip module and the conducting terminals is not accurate easily occurs, which affects contact quality of the entire electrical connector.

Therefore, a heretofore unaddressed need exists in the art to address the aforementioned deficiencies and inadequacies.

SUMMARY OF THE INVENTION

In one aspect, the present invention relates to an electrical connector that enables a chip module to be assembled conveniently and positioned accurately.

In one embodiment, an electrical connector for electrically connecting with a chip module includes an insulating body having a bottom wall, multiple rows of terminals located in the bottom wall and used for electrically connecting with the chip module, and a carrier used for carrying the chip module to the insulating body. Two first side walls extend from two opposite sides of the bottom wall upward, two second side walls extend from the other two opposite sides of the bottom wall upward, and the first side walls and the second side walls define an accommodating cavity used for accommodating the chip module. There is a first gap between the first side wall and a most peripheral terminal corresponding to the first side wall, there is a second gap between the second side wall and a most peripheral terminal corresponding to the second side wall, and the first gap is greater than the second gap. The carrier has a buckling portion for buckling a bottom surface of the chip module, and the buckling portion is received in the first gap.

Compared with the related art, in certain embodiments of the present invention, the electrical connector is provided with a carrier, and the carrier has a buckling portion for buckling a bottom surface of a chip module and carrying the chip module to an insulating body, so that assembly is simple and convenient and positioning is accurate.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector.

Figure 4:
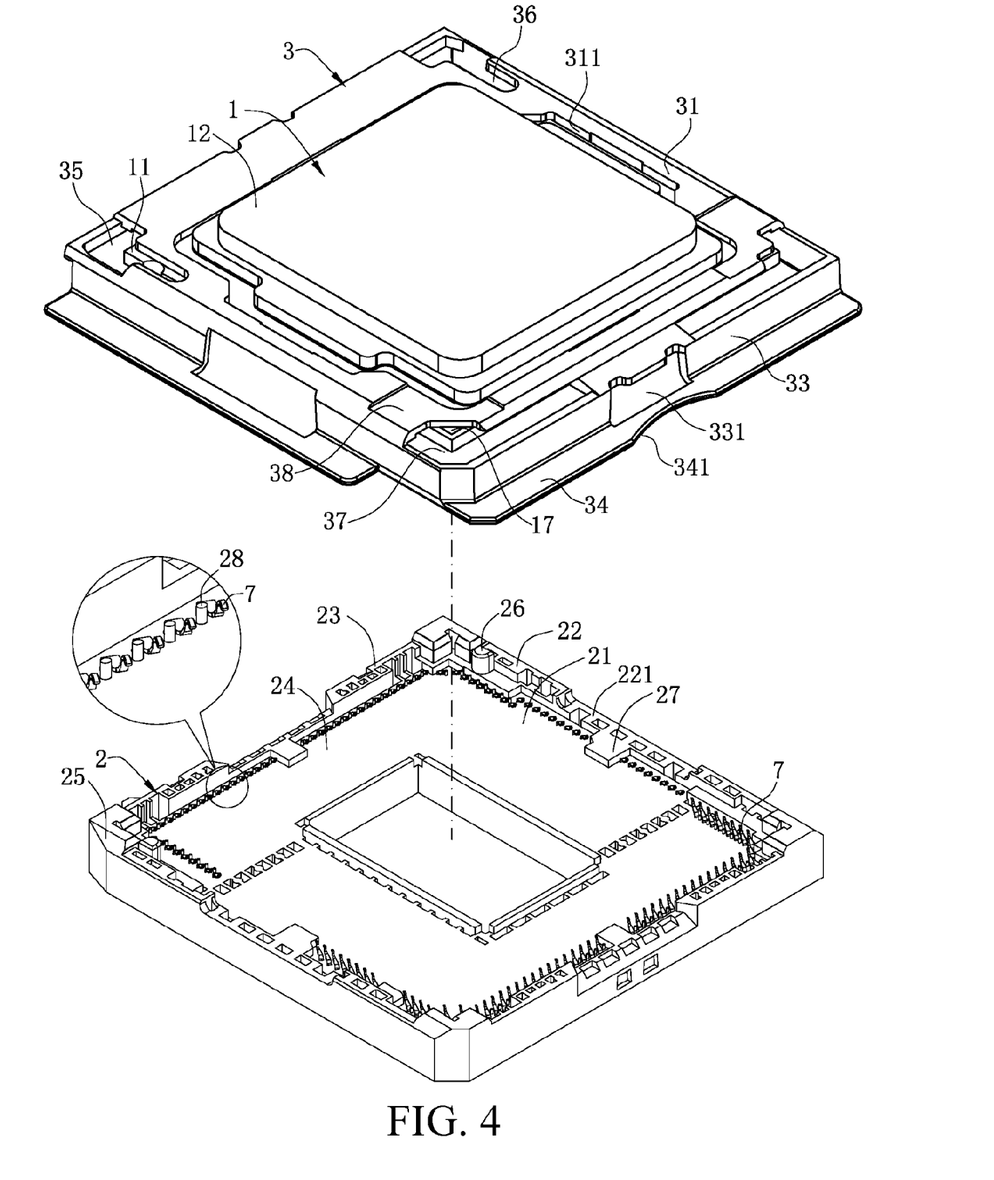
FIG. 4 is a schematic three-dimensional view of the electrical connector according to one embodiment of the present invention before the carrier is assembled to an insulating body.
Figure 5:
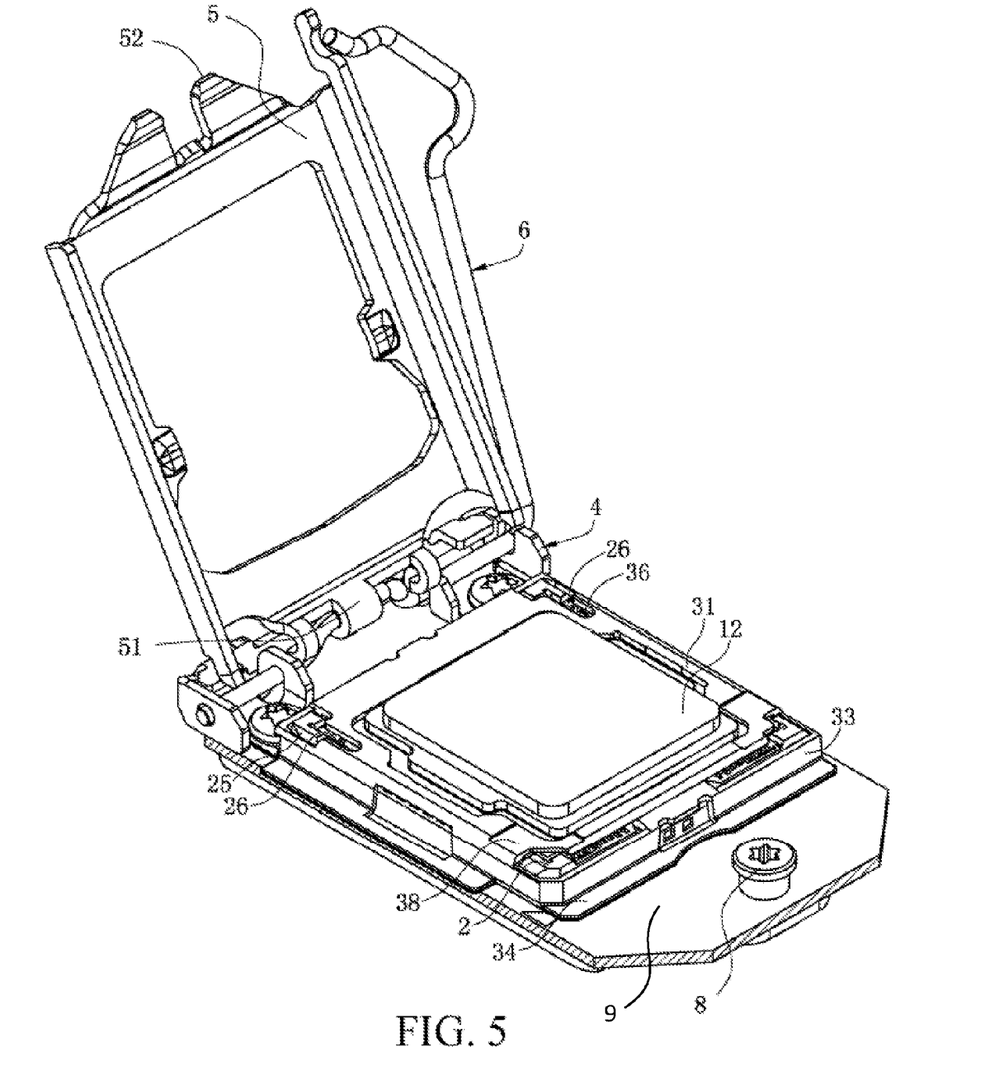
FIG. 5 is a schematic three-dimensional view of the electrical connector according to one embodiment of the present invention after the carrier is assembled to the insulating body.

As shown in FIGS. 4 and 5, an electrical connector according to one embodiment of the present invention is used for electrically connecting a chip module 1 to a circuit board 9. The electrical connector mainly includes an insulating body 2, terminals 7 received in the insulating body 2, a fixing member 4 located behind the insulating body 2, a lever 6 pivotally assembled to the fixing member 4, a pressing plate 5 pivotally assembled to the lever 6, and a carrier 3 used for carrying the chip module 1 to the insulating body 2.

Figure 1:
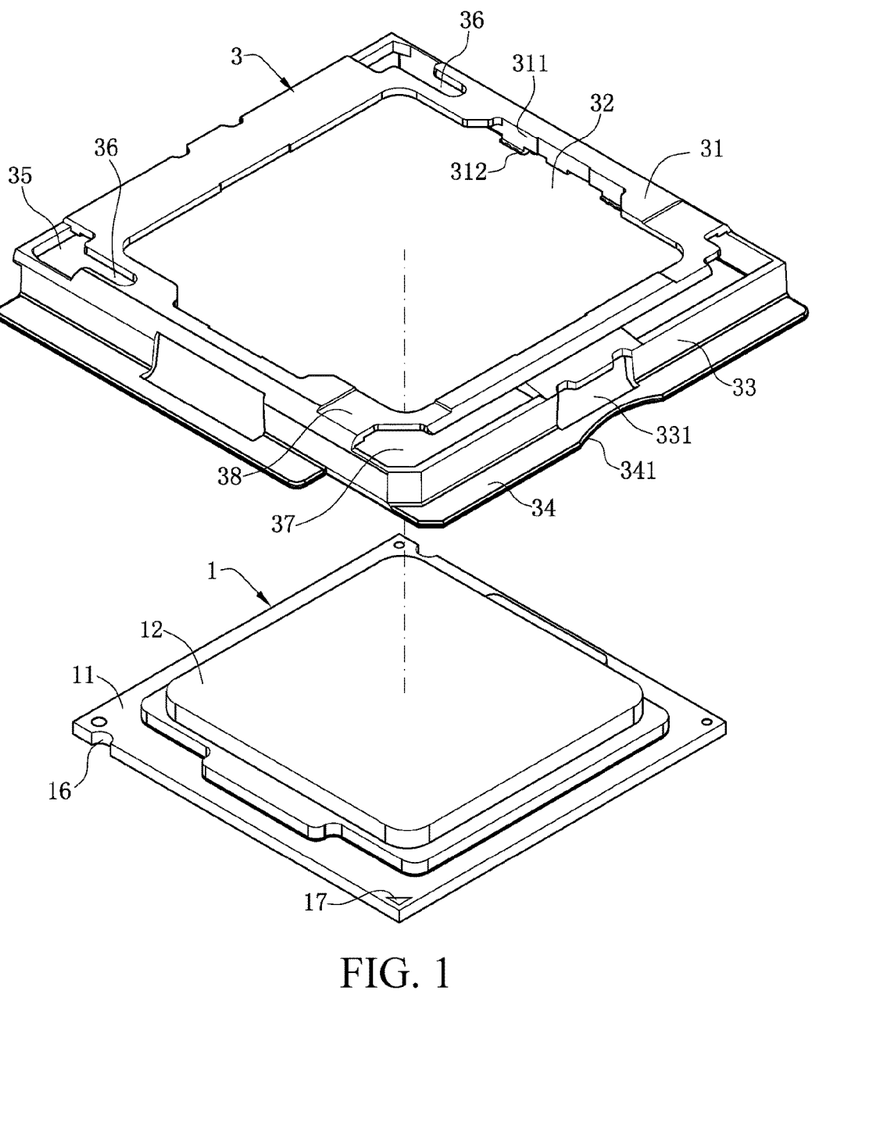
FIG. 1 is a schematic three-dimensional view of an electrical connector according to one embodiment the present invention before a chip module is assembled to a carrier.
Figure 2:
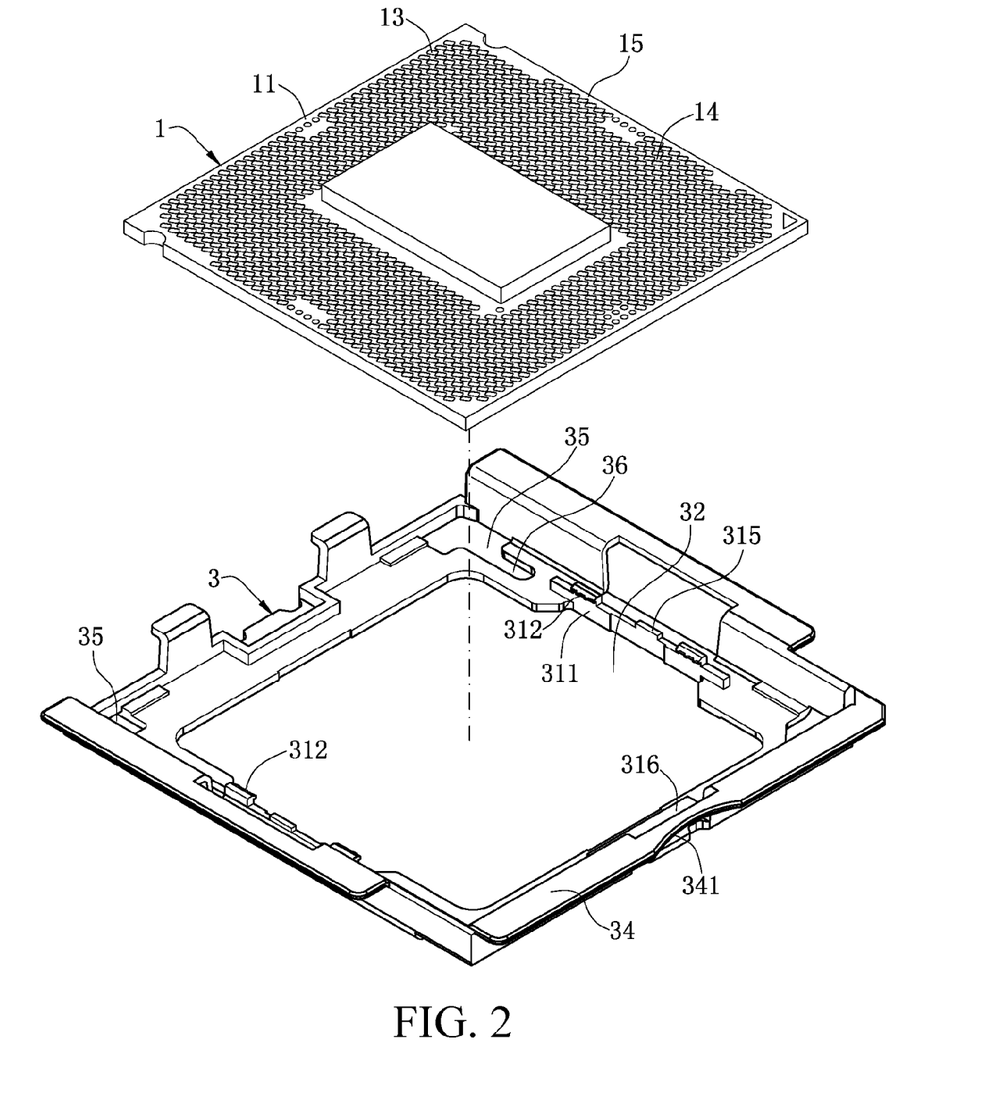
FIG. 2 is a schematic three-dimensional view of the electrical connector in another direction according to one embodiment the present invention before the chip module is assembled to the carrier.
Figure 3:
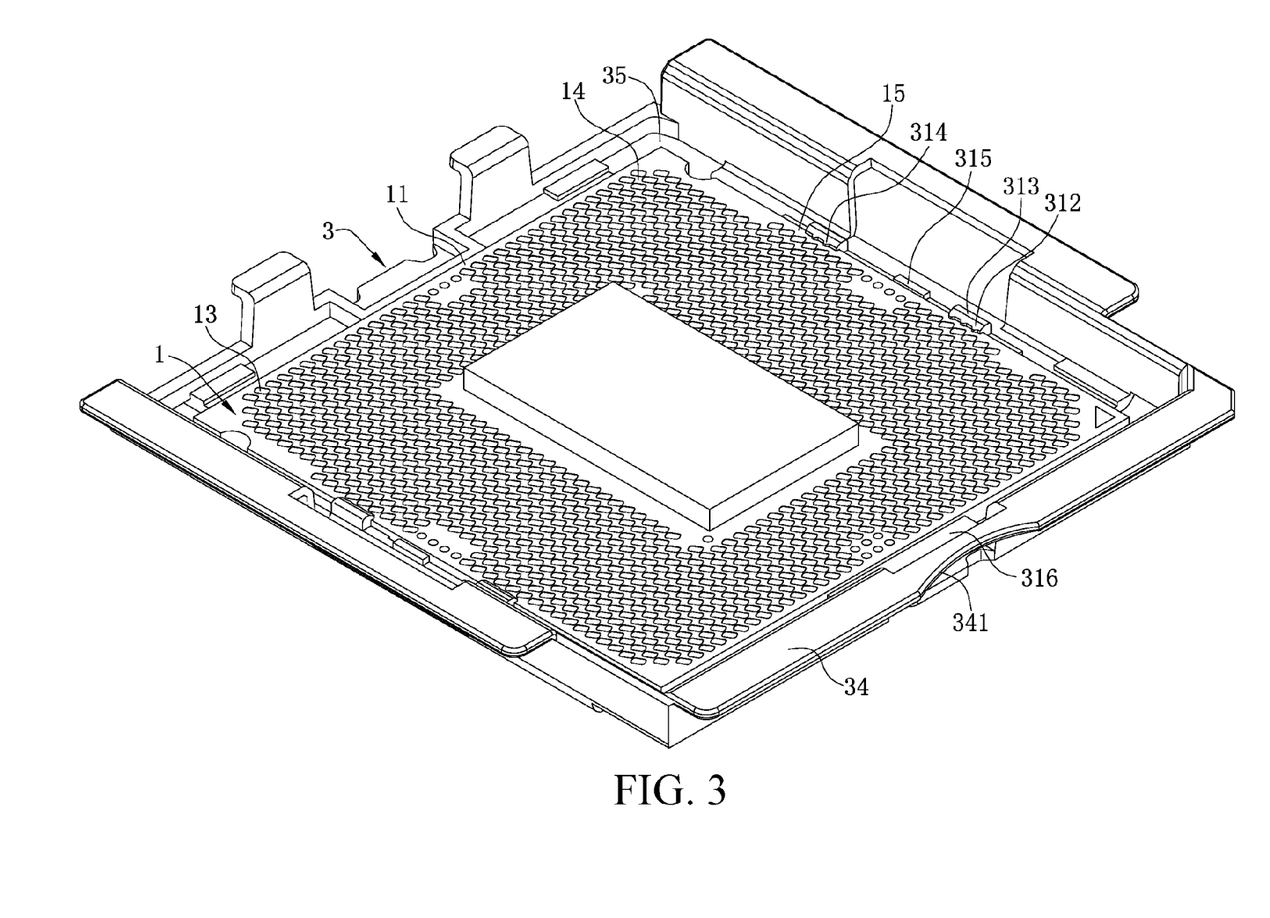
FIG. 3 is a schematic three-dimensional view of the electrical connector according to one embodiment the present invention after the chip module is assembled to the carrier.

As shown in FIGS. 1-3, the chip module 1 includes a base 11 and a protruding portion 12 protruded from the base 11 upward. A bottom surface of the base 11 is provided with a pad area 14 and a perimeter area 15 located around the pad area 14. The pad area 14 is compactly provided with multiple pads 13. Two opposite side edges of the base 11 are each provided with a notch 16, and one of the corners of the base 11 is provided with a triangular recess 17.

Figure 8:
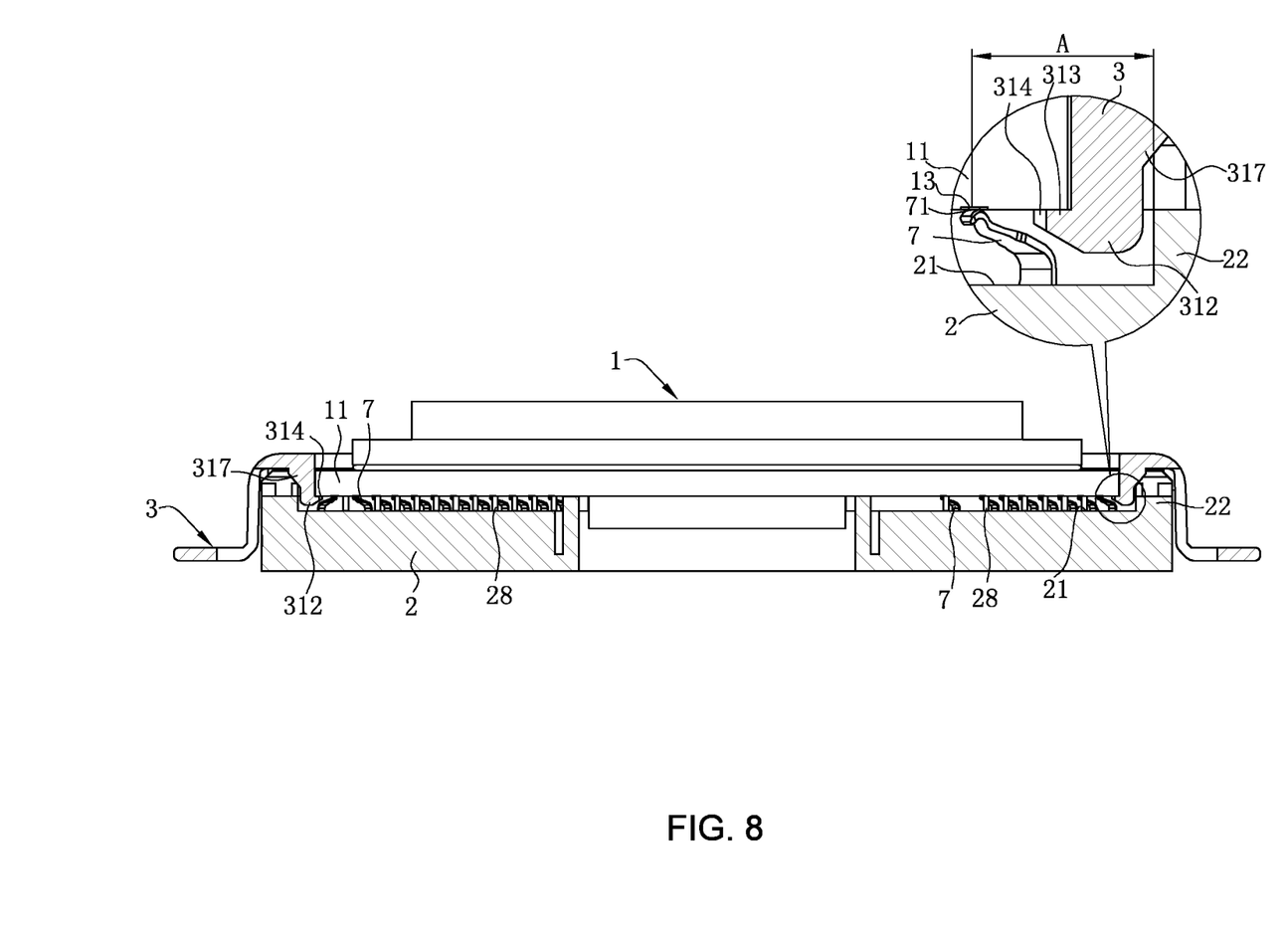
FIG. 8 is a schematic sectional view of the electrical connector according to one embodiment the present invention in another direction.
Figure 9:
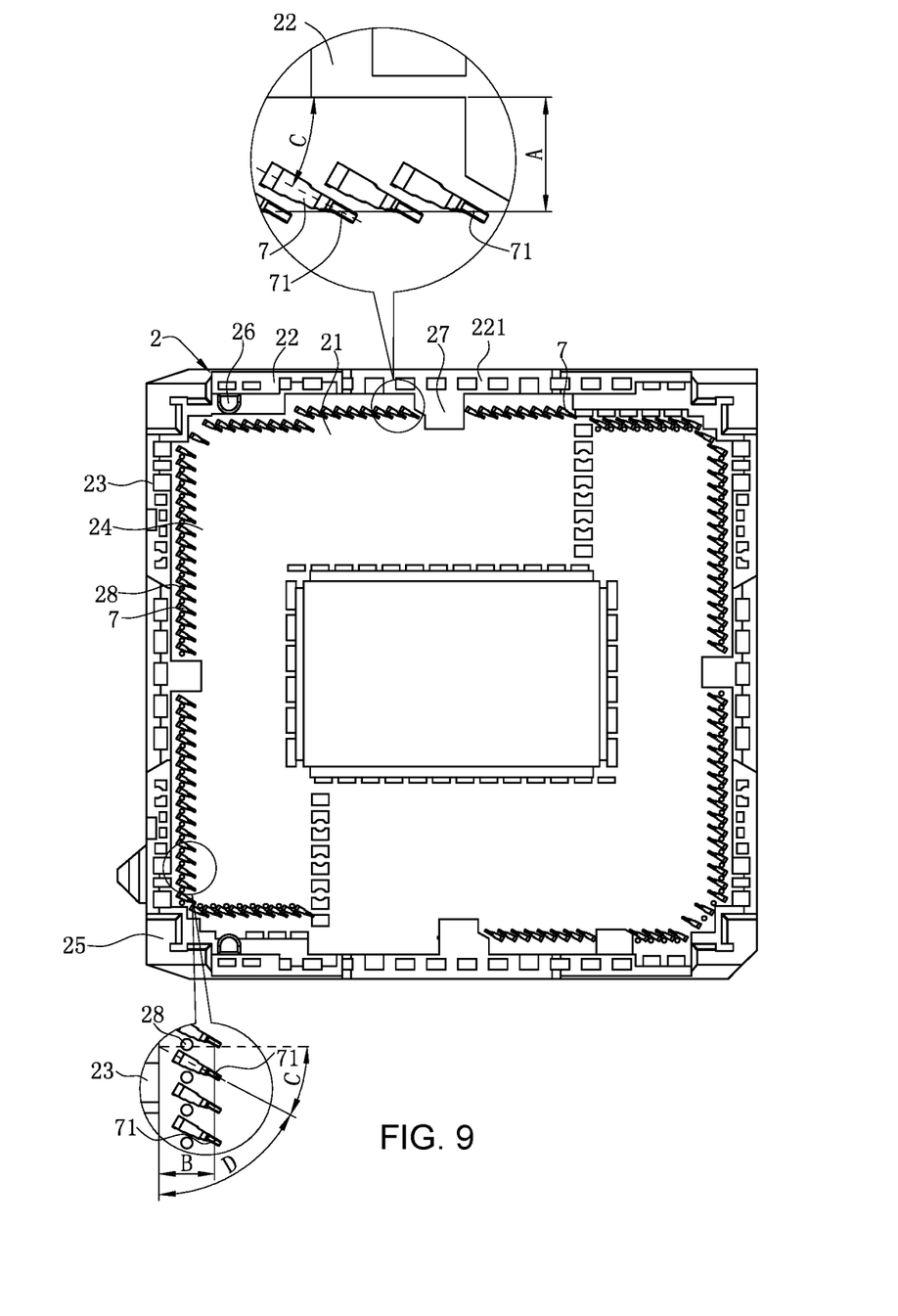
FIG. 9 is a schematic top view of the insulating body and terminals of the electrical connector according to one embodiment the present invention.

As shown in FIGS. 4 and 9, the insulating body 2 is roughly rectangular, and includes a bottom wall 21. Two first side walls 22 extend from two opposite sides of the bottom wall 21 upward, and two second side walls 23 extend from the other two opposite sides of the bottom wall 21 upward. The bottom wall 21, the first side walls 22, and the second side walls 23 jointly define an accommodating cavity 24 for accommodating the chip module 1. The bottom wall 21 receives multiple terminals 7 used for electrically connecting with the pads 13. Each terminal 7 is slanted and has a contact region 71 for electrically connecting with the chip module 1, where the contact region 71 is a highest portion of each terminal 7 in a vertical direction from the bottom wall upward. As shown in FIG. 8, the contact region is a small surface of each terminal 7 that is in contact with the base 11 of the chip module 1. For a row of terminals that is the closest to an inner surface of one of the first side walls 22, each of the contact region 71 has a center point located in the middle of that contact region 71, and the center points of the row of terminals form a first line. For a row of terminals that is the closest to an inner side of one of the second side walls 23, each of the contact region 71 has a center point located in the middle of that contact region 71, and the center points of the row of terminals form a second line. There is a first gap A between the first line and the inner surface of the corresponding one of the first side walls 22, and there is a gap B between the second line and the inner surface of the corresponding one of the second side walls 23. The first gap A is greater than the second gap B. Each terminal 7 has a center line separating the plate of the terminal 7 into halves. As viewed from top, an acute angle formed between at least one of the first side wall 22 and the center line of a corresponding terminal 7 (in other words, one of the terminals 7 that is disposed along the side wall 22) is less than an acute angle formed between at least one of the second side wall 23 and the center line of a corresponding terminal 7 (in other words, one of the terminals 7 that is disposed along the second side wall 23). The first side wall 22 is provided with a concave portion 221 for reserving the carrier 3. The concave portion 221 runs through the first side wall 22 along a horizontal direction, and a bottom surface of the concave portion 221 is higher than the upper surface of the bottom wall 21. A post 26 protrudes from the first side wall 22 toward the accommodating cavity 24, and the post 26 and the notch 16 cooperate, and are used for correctly assembling the chip module 1 into the accommodating cavity 24. Two ends of the first side wall 22 and two ends of the second side wall 23 are each provided with a stop wall 25 protruded upward. The stop wall 25 is located outside of the chip module 1, is higher than a bottom surface of the chip module 1, and is used for stopping the chip module 1. A supporting block 27 projects from the upper surface of the bottom wall 21 upward, is connected to the first side wall 22, and is used for supporting the carrier 3. Multiple bosses 28 project from the upper surface of the bottom wall 21 and are disposed between some adjacent terminals 7, and are used for supporting the chip module 1.

Figure 6:
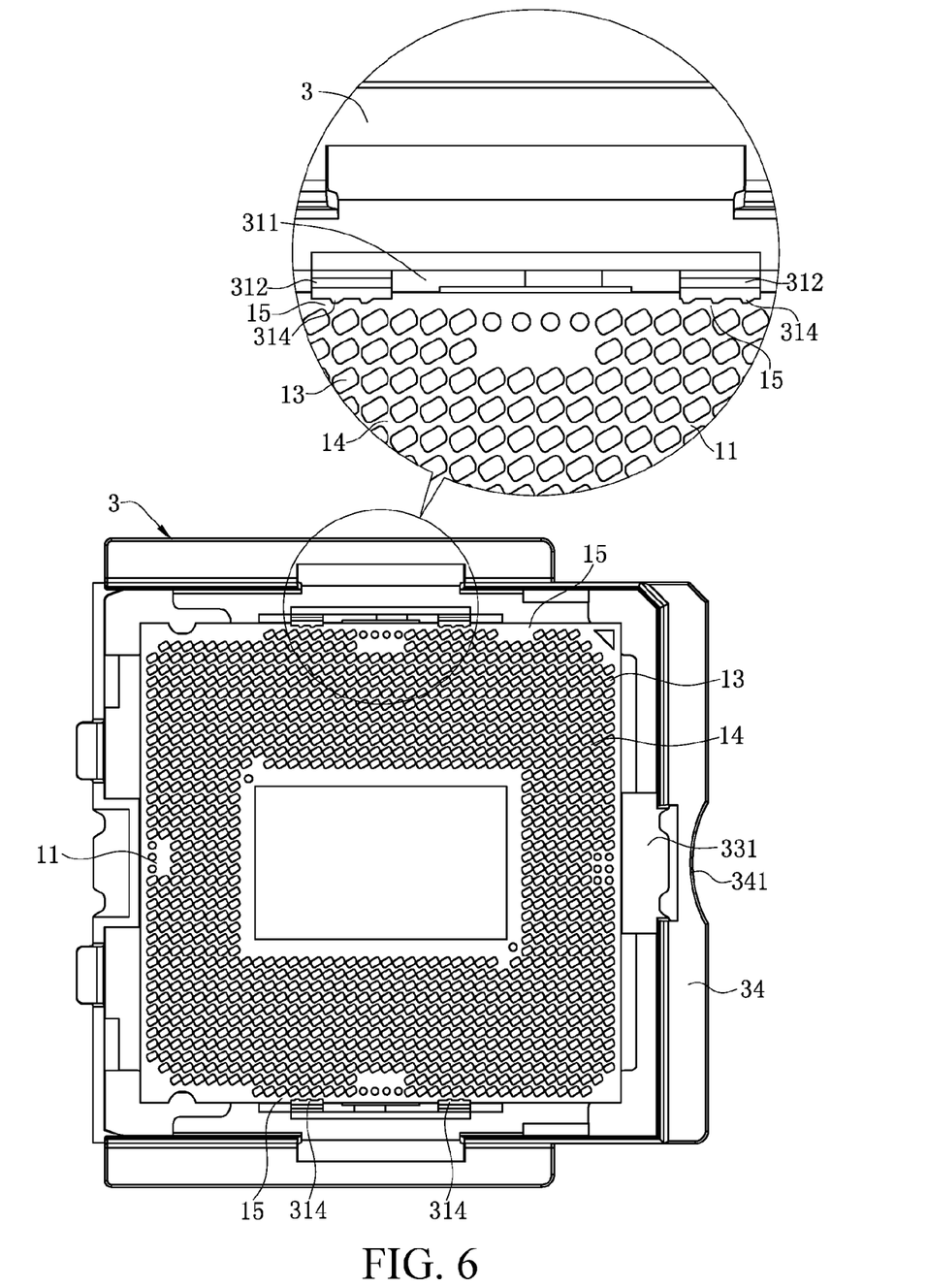
FIG. 6 is a schematic bottom view of the electrical connector according to one embodiment of the present invention after the chip module is assembled to the carrier.
Figure 7:
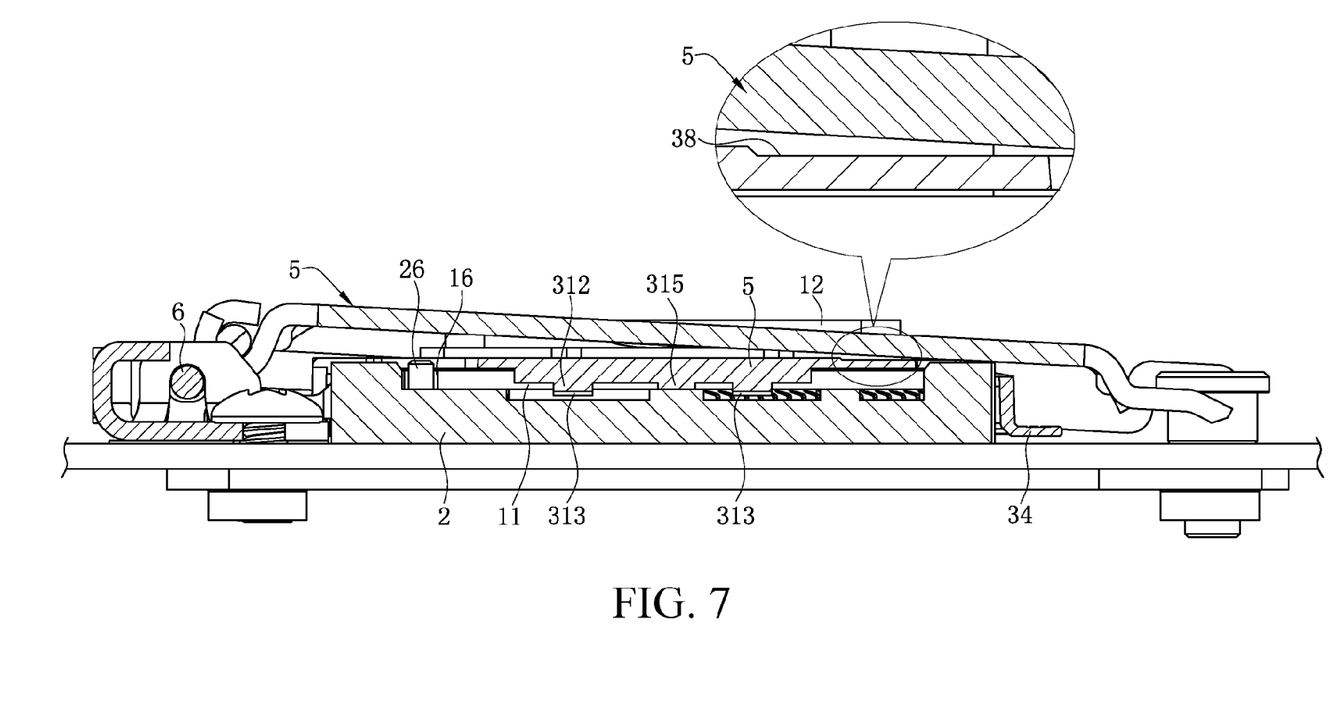
FIG. 7 is a schematic sectional view showing that a pressing plate of the electrical connector is closed according to one embodiment the present invention.

As shown in FIGS. 1, 6, and 8, the carrier 3 includes a frame 31 located above the base 11. The frame 31 is centrally provided with an opening 32 for the protruding portion 12 to pass through. A reinforcing portion 311 extends from each of two opposite sides of the bottom surface of the frame 31 downward, and a side of the reinforcing portion 311 urges a side edge of the chip module 1. Two buckling portions 312 extend from each reinforcing portion 311 downward, and the buckling portions 312 are received in the first gap A. The reinforcing portion 311 is provided with a protruding rib 317 laterally projecting relative to the buckling portion 312. The protruding rib 317 is reduced in width from top to bottom, and the protruding rib 317 is received in the reserved slot 211. A highest point of the boss 28 is higher than a lowest point of the buckling portion 312, and the upper surface of the bottom wall 21 is not provided with boss 28 for supporting the chip module 1 right below the buckling portion 312. The buckling portion 312 includes a grab 313 and multiple protrusions 314 extending from an end of the grab 313. Each of the protrusions 314 is located between two adjacent terminals 7 that are most peripheral. The width of the grab 313 is greater than the width of each of the protrusions 314. Alternatively, in other embodiments, it may also be that only one protrusion 314 extends from the grab 313, and the width of the grab 313 is the same as that of the protrusion 314. The grab 313 and the protrusion 314 are buckled to the perimeter area 15. The length of the protrusion 314 extends toward a gap between two adjacent pads 13 of the pad area 14 that are most peripheral, and the width of the protrusion 314 is less than the width of the gap. Two adjacent side edges of two adjacent pads 13 are correspondingly parallel to two side edges corresponding to the protrusion 314. The reinforcing portion 311 is provided with a protruding block 315 extending downward, and the protruding block 315 is supported on the supporting block 27, thereby preventing the carrier 3 from excessively pressing downward. A stop block 316 projecting from each of the other two sides of the bottom surface of the frame 31 downward may be stopped at the outer side of the base 11, so as to prevent the chip module 1 from shaking The carrier 3 has multiple positioning portions 33 extending from the periphery of the frame 31 downward that are correspondingly located at outer sides of the first side wall 22 and the second side wall 23, to position the carrier 3 at the insulating body 2. Each of the positioning portions 33 is provided with a groove 331 which helps an operator grasp the carrier 3. A flat plate portion 34 extends horizontally from a lower end of each positioning portion 33 outward. When the carrier 3 is assembled to the insulating body 2, and position deviation occurs in the carrier 3, the flat plate portion 34 urges the top surface of the stop wall 25, which may ensure that the positioning portion 33 cannot enter the accommodating cavity 24, thereby protecting the terminals 7. The flat plate portion 34 at the front end of the carrier 3 is provided with an arc-shaped notch 341, which reserves a finger of the operator, and helps operation. The back end of the carrier 3 is provided with two flat plate portions 34, and there is a gap between the two flat plate portions 34.

The carrier 3 is provided with a reserved hole 35 for reserving the stop wall 25, and the reserved hole 35 is defined by the frame 31 and the positioning portion 33. The frame 31 is provided with a through hole 36 in communication with the reserved hole 35, and the notch 16 is exposed from the through hole 36. The frame 31 is provided with a through slot 37 in communication with the reserved hole 35.

The through slot 37 is spaced from the opening 32, and the recess 17 is exposed from the through slot 37. The top surface of the carrier 3 is provided with a depressed portion 38 used for reserving the pressing plate 5 when the pressing plate 5 is rotated and closed.

As shown in FIG. 5, the fixing member 4 is made by punching a metal plate material, is located behind the insulating body 2, and is fixed onto the circuit board 9 by using a screw. The back end of the pressing plate 5 is provided with a pivotal portion 51 pivotally connected onto the lever 6, so that the pressing plate 5 is able to rotate around the pivotal portion 51 relative to the insulating body 2. The pivotal portion 51 and the buckling portion 312 are located at different sides of the bottom wall 21. A front end of the pressing plate 5 is provided with a tongue 52. A locking member 8 passes through the tongue 52 and is fixed onto a circuit board 9. The locking member 8 and the buckling portion 312 are located at different sides of the bottom wall 21.

During use of the electrical connector according to one embodiment of the present invention, the chip module 1 is assembled into the carrier 3, and the chip module 1 is buckled by using the grab 313 and the protrusion 314 so as to fix the chip module 1 to the carrier 3. In this case, the notch 16 and the recess 17 of the chip module 1 are correspondingly exposed from the through hole 36 and the through slot 37 of the carrier 3, respectively.

Then, the operator stretches a finger into the groove 331 to grasp the carrier 3, adjusts the direction of the carrier 3 by observing the recess 17 and cooperation of the notch 16 and the post 26, and assembles the carrier 3 to the insulating body 2 vertically downward, so that the pads 13 of the chip module 1 contact the terminals 7. In this case, the frame 31 of the carrier 3 is located above the accommodating cavity 24, and the positioning portions 33 are correspondingly located outside of the first side wall 22 and the second side wall 23.

Then, the pressing plate 5 rotates and covers the chip module 1, and finally, the lever 6 is correspondingly rotated to press the pressing plate 5

Certainly, the carrier 3 is not limited to this embodiment. In other embodiments, the carrier 3 may further be formed by two separate clamping units, and each clamping unit is provided with the grab 313 and the protrusion 314 that are used for fixing the chip module 1 to the clamping unit. The two clamping units respectively clamp two opposite sides of the chip module 1 to carry the chip module 1 to the insulating body 2, so that the chip module 1 contacts the terminals 7. After the chip module 1 is assembled to the insulating body 2, the clamping units may be removed.

Certain embodiments of the present invention, among other things, has the following beneficial advantages.

1. Each buckling portion 312 is received in the first gap A larger than the second gap B, so that the buckling portion 312 may be prevented from contacting any of the terminals 7 to damage the terminals 7.

2. Because the upper surface of the bottom wall 22 is not provided with boss 28 used for supporting the chip module 1 right below the buckling portion 312, a damage caused by an interference between the buckling portion 312 and the boss 28 may be prevented.

3. Because the protrusion 314 is formed by extending from the end of the corresponding grab 313, and the grab 313 and the protrusion 314 are buckled to the perimeter area 15 of the chip module 1, a force of the carrier 3 for buckling the chip module 1 can be enhanced. The length of the protrusion 314 extends toward the gap between the two adjacent pads 13 of the pad area 14 that are most peripheral, and the width of the protrusion 314 is less than the width of the gap, so that a space exists between the protrusion 314 and the pad 13, so as to prevent the pads 13 from being scratched.

4. Because the carrier 3 is provided with the through hole 36 and the through slot 37 that enable the notch 16 and the recess 17 to be exposed respectively, the direction of the carrier 3 may be observed and adjusted when the carrier 3 is assembled to the insulating body 2, thereby correctly assembling the carrier 3 into the insulating body 2.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting with a chip module, comprising:
   an insulating body having a bottom wall, wherein two first side walls extend from two opposite sides of the bottom wall upward, two second side walls extend from the other two opposite sides of the bottom wall upward, and a direction from the bottom wall upward is defined as a vertical direction;
   multiple rows of terminals located in the bottom wall, wherein a highest portion of each terminal in the vertical direction, which is a surface, defines a contact region for electrically connecting with the chip module, for a first row of terminals that is the closest to an inner surface of one of the first side walls, each contact region of the first row of terminals has a first center point, the first center points of the first row of terminals form a first line, for a second row of terminals that is the closest to one of an inner surface of the second side walls, each contact region of the second row of terminals has a second center point, the second center points of the second row of terminals form a second line, and in a top view along the vertical direction downward, there is a first gap between the inner surface of the one of the first side walls and the first line and there is a second gap between the inner surface of the one of the second side walls and the second line, and the first gap is greater than the second gap; and
   a carrier used for carrying the chip module to the insulating body, wherein the carrier has at least one buckling portion for buckling a bottom surface of the chip module, and the buckling portion is received in the first gap.

2. The electrical connector of claim 1, wherein in the top view, each of the terminals is slanted such that a center line of each terminal forms a first acute angle with the first side walls and forms a second acute angle with the second side walls, and the first acute angle is less than the second acute angle.

3. The electrical connector of claim 1, further comprising a plurality of bosses disposed on an upper surface of the bottom wall, and used for supporting the chip module, wherein each of the bosses is located between two of the terminals that are adjacent to each other, a highest point of each boss is higher than a lowest point of the buckling portion, and the upper surface of the bottom wall has no boss right below the buckling portion.

4. The electrical connector of claim 1, further comprising a pressing plate for pressing the chip module and covering the insulating body, wherein a back end of the pressing plate is provided with a pivotal portion such that the pressing plate is rotatable around the pivotal portion, and the pivotal portion and the buckling portions are located at different sides of the bottom wall.

5. The electrical connector of claim 4, wherein a front end of the pressing plate is provided with a tongue, a locking member passes through the tongue and is fixed onto a circuit board, and the locking member and the buckling portion are located at different sides of the bottom wall.

6. The electrical connector of claim 4, wherein a top surface of the carrier is provided with at least one depressed portion for reserving the pressing plate.

7. The electrical connector of claim 1, wherein the carrier comprises a frame, the frame is provided with an opening for the chip module to pass through, two reinforcing portions extends from a bottom surface of the frame downward, the number of the at least one buckling portion is two, the two buckling portions each extend from corresponding one of the reinforcing portions downward respectively, each of the first side walls is provided with a concave portion for receiving corresponding one of the reinforcing portions, and the buckling portions are located above an upper surface of the bottom wall.

8. The electrical connector of claim 7, wherein each of the concave portions runs through corresponding one of the first side walls along a horizontal direction, and a bottom surface of each of the concave portions is higher than the upper surface of the bottom wall.

9. The electrical connector of claim 7, wherein each of the reinforcing portions is provided with a protruding rib laterally projecting relative to corresponding one of the buckling portions, the protruding rib is reduced in width from top to bottom, and the protruding rib is accommodated in corresponding one of the concave portions.

10. The electrical connector of claim 7, wherein a side of each of the reinforcing portions urges corresponding one of side edges of the chip module.

11. The electrical connector of claim 7, wherein the two opposite reinforcing portions extend from the bottom surface of the frame downward, and at least two of the buckling portions extend from each of the reinforcing portions downward.

12. The electrical connector of claim 7, wherein the first side walls and the second side walls are each provided with a stop wall protruding upward that is located outside of the chip module, is higher than the bottom surface of the chip module, and is used for stopping the chip module, the carrier is provided with multiple positioning portions that extend from the frame downward and are correspondingly located outside of the first side walls and the second side walls to position the carrier at the insulating body, the carrier is provided with a reserved hole for reserving the stop wall, and the reserved hole is defined by the frame and the positioning portion.

13. The electrical connector of claim 7, wherein a post protrudes from at least one of the first side walls, the chip module is provided with a notch engaging with the post, the frame is provided with at least one through hole in communication with the reserved hole, and the notch is exposed to the through hole.

14. The electrical connector of claim 7, wherein the chip module is provided with a triangular recess used for aligning the chip module with the insulating body, the frame is provided with a through slot in communication with the reserved hole, the through slot is spaced from the opening, and the recess is exposed to the through slot.

15. The electrical connector of claim 1, wherein the bottom surface of the chip module is provided with a pad area and a perimeter area that is located around the pad area, the pad area is provided with multiple pads used for electrically connecting with the terminals, an end of the buckling portion is provided with multiple protrusions, the protrusions are buckled to the perimeter area, each of the protrusions extends in a length direction toward a gap between two of the pads that are adjacent to each other and are most peripheral of the pad area, and a width of each of the protrusions is less than a width of the gap.

16. The electrical connector of claim 15, wherein each of the protrusions is located between two of the terminals that are adjacent to each other and are most peripheral.

17. The electrical connector of claim 15, wherein the buckling portion comprises a grab buckled to the perimeter area, multiple spaced protrusions extend from the grab, and the width of the protrusion is less than a width of the grab.

18. The electrical connector of claim 15, wherein two adjacent side edges of two adjacent pads are correspondingly parallel to two side edges of corresponding one of the protrusions.

19. The electrical connector of claim 12, wherein at least one flat plate portion extends horizontally from a lower end of each of the positioning portions.

20. The electrical connector of claim 19, further comprising a pressing plate for pressing the chip module and covering the insulating body, wherein a back end of the pressing plate is provided with a pivotal portion located behind the second side wall, so that the pressing plate is rotatable around the pivotal portion relative to the insulating body, a back end of the carrier is provided with two flat plate portions, and there is a gap between the two flat plate portions that is used for reserving the pivotal portion.

* * * * *